United States Patent [19]
Kerber et al.

[11] Patent Number: 6,110,392
[45] Date of Patent: Aug. 29, 2000

[54] PROCESS FOR REDUCING SURFACE ROUGHNESS OF SUPERCONDUCTOR INTEGRATED CIRCUIT HAVING A GROUND PLANE OF NIOBIUM NITRIDE OF IMPROVED SMOOTHNESS

[75] Inventors: George L. Kerber, San Diego; Michael Leung, Lomita, both of Calif.

[73] Assignee: TRW Inc., Redondo Beach, Calif.

[21] Appl. No.: 09/157,069

[22] Filed: Sep. 18, 1998

[51] Int. Cl.$^7$ .................................. C23F 1/00; B44C 1/22
[52] U.S. Cl. ................................ 216/3; 216/38; 505/410; 505/731; 505/820; 427/63
[58] Field of Search ........................... 257/32–33; 216/3, 216/38; 505/410, 731, 820; 427/63

[56] References Cited

U.S. PATENT DOCUMENTS 5,477,061  12/1995  Morohashi ................................ 257/35

OTHER PUBLICATIONS

Barfnecht, A. T. et al., "Josephson Junction Integrated Circuit Process with Planarized PECVD SiO2 Dielectric," IEEE Trans. on Applied Superconductivity, vol. 3, No. 1, Mar. 1993, pp. 2201–2203.

Kerber, G. L. et al., "An Improved NbN Integrated Circuit Process Featuring Thick NbN Ground Plane and Lower Parasitic Circuir Inductances," IEEE Trans. on Applied Superconductivity, vol. 7, No. 2, Jun. 1997, pp. 2638–2643.

Kohlstedt, H. et al., "Double Barrier Long Josephson Junctions with a Contact to the Intermediate Superconducting Layer," IEEE Trans. On Applied Superconductivity, vol. 5, No. 2, Jun. 1995, pp. 2939–2942.

Marathe, Amit P. et al., "Planarization Techniques for Multilevel HTS Integrated Circuit Process," IEEE Trans. on Applied Superconductivity, vol. 3, No. 1, Mar. 1993, pp. 2373–2376.

Marathe, Amit P. et al., "Process Issues and Components for HTS Digital Integrated Circuit Fabrication," IEEE Trans. on Applied Superconductivity, vol. 5, No. 2, Jun. 1995, pp. 3135–3138.

Nagasawa, S. et al., "Nb Multilayer Planarization Technology for a Subnanosecond Josephson 1K–Bit RAM," IEEE Trans. on Magnetics, vol. 25, No. 2, Mar. 1989, pp. 777–782.

Tarutani, Yoshinobu et al., "Niobium–Based Integrated Circuit Technologies," Proc. of the IEEE, vol. 77, No. 8, Aug. 1989, pp. 1164–1176.

*Primary Examiner*—John Guay
*Attorney, Agent, or Firm*—Michael S. Yatsko

[57] ABSTRACT

The invention is a process for reducing roughness of a surface of a superconductor material (23) having an undesirable surface roughness (30 and 32) and a trilayer superconductor integrated circuit (100). The process for reducing roughness of a surface of superconductor material having an undesirable surface roughness includes coating the surface with an oxide layer (40) to fill the undesirable surface roughness and to produce an exposed oxide surface (42) with a roughness less than the surface roughness; and etching the exposed oxide surface to remove a thickness of the oxide layer followed by removing at least a portion of the oxide layer filling the undesirable surface roughness and a portion of the surface of the superconductor material to produce an exposed etched surface (44) comprised of at least the superconductor material which has a surface roughness less than the undesirable surface roughness.

11 Claims, 3 Drawing Sheets

PROCESS FOR REDUCING SURFACE ROUGHNESS OF SUPERCONDUCTOR INTEGRATED CIRCUIT HAVING A GROUND PLANE OF NIOBIUM NITRIDE OF IMPROVED SMOOTHNESS

BACKGROUND OF THE INVENTION

Field of the Invention

The present invention relates to processes for reducing surface roughness of superconductor and semiconductor materials and more particularly, to processes for reducing the surface roughness of niobium nitride (NbN) and to superconductor integrated circuits formed on a ground plane of NbN.

DESCRIPTION OF THE PRIOR ART

Superconductor integrated circuits utilizing NbN ground plane have been developed which operate at 10 K. These circuits utilize a thick (500 nm) NbN ground plane layer disposed on thermally oxidized silicon wafers and trilayer Josephson junction for the active device. The thick NbN layer has a high surface roughness which prevents direct fabrication of trilayer devices on the top surface thereof as described below in more detail in conjunction with FIG. 2

Superconductor niobium nitride integrated circuits having NbN/MgO/NbN trilayer devices have substantial high current density tunnel junctions ranging from 1,000 A/cm$^2$ to 5,000 A/cm$^2$. See G. L. Kerber et al., "An Improved NbN Integrated Circuit Process Featuring Thick NbN Ground Plane and Lower Parasitic Circuit Inductances", IEEE Transactions Applications of Semiconductors, Vol. 7, pp. 2638–2643 (June 1997). This publication is incorporated by reference herein in its entirety.

While the use of bias sputtered SiO$_2$ effectively smooths the surface roughness of a NbN ground plane to enable the fabrication of high current density NbN/MgO/NbN trilayer devices over the thick NbN ground plane, there still exists a problem that this process produces NbN/MgO/NbN devices with unacceptably high inductance existing between the NbN/MgO/NbN trilayer devices and the ground plane which is the result of the layer of SiO$_2$ spacing the NbN/MgO/NbN trilayer devices from the ground plane.

FIG. 1 illustrates a simplified cross section of a prior art NbN/MgO/NbN trilayer device in accordance with the foregoing publication and as described in the Assignee's patent application Ser. Nos. 08/833,954 and 09/066,494 respectively filed on Oct. 20, 1997 and Jan. 13, 1998, and each entitled Low Inductance Superconductive Integrated Circuit and Method of Fabricating the Same which applications are incorporated herein by reference in their entirety. The trilayer device 10 has a NbN base electrode 12, a MgO tunnel barrier 14 of approximately 1 nm in thickness and a NbN counter electrode 16. Tunnel barriers of other materials such as AlN and oxidized metal may be used. The bias sputtered layer 18 of SiO$_2$ has a top surface 22 having sufficient surface smoothness to permit direct fabrication of NbN/MgO/NbN trilayer devices 10 on the smoother top surface. The SiO$_2$ layer 18 spaces the NbN/MgO/NbN trilayer devices from the unacceptably rough top surface 22 of the NbN ground plane 23. The unacceptable surface roughness of the top surface 22, which is described below in conjunction with FIG. 2, prevents the NbN/MgO/NbN trilayer devices 10 from being directly formed on the NbN ground plane 23. The contoured portion 24 of the base electrode 12 which connects the devices 10 to the NbN ground plane 23, adds parasitic inductance to the NbN/MgO/NbN integrated circuit which decreases the switching speed below that which may be achieved if the NbN/MgO/NbN trilayer was formed directly on surface 22. In FIG. 1, the trilayer devices 10 are spaced approximately 150 nm away from the ground plane 22 which spacing is sufficient to effectively prevent excessive leakage or even short circuits but results in the aforementioned increased parasitic inductance.

FIG. 2 illustrates a cross sectional view of a thick NbN ground plane 23 which has been prepared in accordance with the prior art discussed above. This ground plane is typically 500 nm in thickness and is characterized by a fine grain columnar structure. The surface roughness is on the order of 4 nm rms. The peak 30 to valley 32 roughness ranges typically from 15–20 nm. NbN surface roughness increases faster than the film thickness which makes it impossible to make a thick film NbN ground plane, which is known to reduce parasitic inductance, sufficiently smooth to permit direct fabrication of NbN/MgO/NbN trilayer devices 10 on the ground plane 23. This surface roughness is so great that either excessive leakage or short circuits would result if the trilayer devices 10 were fabricated directly on the NbN ground plane 23.

Etch back planarization is known which utilizes a polymer to fill rough semiconductor surfaces. The resultant product is not sufficiently smooth to permit fabrication of circuits requiring smoothness on the order of that required to permit NbN/MgO/NbN trilayer devices to be directly formed on a NbN ground plane.

Single crystal NbN can be made smooth but large scale fabrication useful for integrated circuits is difficult to achieve because of many surface defects which make the resultant NbN/MgO/NbN trilayer junctions inoperative.

Superconductor films of niobium titanium nitride have reduced surface roughness of approximately 1 nm. However, niobium titanium nitride is subject to high stress making it unusable for NbN/MgO/NbN trilayer devices having a ground plane for reducing parasitic inductance.

SUMMARY OF THE INVENTION

The invention is a process for reducing roughness of a surface of a superconductor and/or semiconductor material which has a preferred application of reducing the surface roughness of a NbN superconductor substrate functioning as a ground plane in superconductor Josephson junction-type integrated circuits and further to any trilayer superconductor integrated circuit having NbN/Mgo/NbN trilayer devices formed on a thick NbN ground plane which has been processed to reduce surface roughness in accordance with the process of the present invention to permit direct fabrication of the trilayer devices on the ground plane.

A process for reducing roughness of a surface of a superconductor material having an undesirable surface roughness in accordance with the invention includes coating the surface with an oxide layer to fill the undesirable surface roughness and to produce an exposed oxide surface with a roughness less than the undesirable surface roughness of the superconductor material on which the coating is applied. The coating is preferably SiO$_2$ which has been bias sputtered with a low frequency, such as 40 kHz, which produces a smooth oxide film having a surface roughness which is substantially less than the roughness of the NbN and may be less than 0.1 nm rms. Thereafter, the exposed oxide surface is etched to remove a thickness of the oxide layer followed by removing at least a portion of the oxide layer filling the undesirable surface roughness and a portion of the surface of the superconductor material to produce an exposed etched surface comprised of at least the superconductor material which has surface roughness less than the undesired surface roughness. The exposed etched surface may also comprise the oxide layer.

The etching is produced by an etching material which etches each of the oxide layer and the superconductor material at substantially the same rate (as close to 1:1 as possible) so that a surface roughness of the exposed surface is replicated on the exposed etched surface. As a result, the top surface of the superconductor material, which is preferably NbN, has a surface smoothness sufficient to permit Josephson junction trilayer devices such as NbN/MgO/NbN or NbN/AlN/NbN devices to be formed directly on the NbN ground plane. The oxide layer is preferably $SiO_2$ coated on the superconductor layer by sputtering. Preferably, the sputter deposition is bias sputtering (substrate is biased using low frequency such as 40 kHz) and the etching is dry etching. A preferred etching composition comprises a mixture of $O_2$ and a gas containing C, H and a halogen with $CHF_3$ being one preferred composition.

Trilayer-based superconductor integrated circuits formed directly on a substrate of NbN have reduced parasitic inductance consequent from eliminating the contoured portion 24 of base electrode 12 in the prior art of FIG. 1 to connect the trilayer devices to the thick NbN ground plane which produced unacceptably high parasitic inductance.

A trilayer-based superconductor integrated circuit formed on a thick NbN ground plane film in accordance with the invention includes a ground plane of NbN formed by the process of coating a surface of the NbN having an undesirable surface roughness with an oxide layer to fill the undesirable surface roughness and to produce an exposed oxide surface. Thereafter, the exposed oxide surface is etched to remove a thickness of the oxide layer followed by removing at least a portion of the oxide layer filling the surface roughness and a portion of the surface of the NbN to produce an exposed etched surface comprised of the NbN which has a roughness less than the undesirable surface roughness. At least one trilayer device is formed on the ground plane of NbN each including a base electrode in surface contact with the exposed etched surface, a tunnel layer in surface contact with the base electrode, a counter electrode of NbN in surface contact with the top surface of the tunnel layer, and a wiring layer is in surface contact with a top surface of the counter electrode. Preferably, the exposed etched surface also comprises the oxide layer. The tunnel layer is preferably AlN or MgO. The etching of the substrate of NbN is performed with an etching material which etches each of the oxide layer and the superconductor material at substantially the same rate (1:1 is preferable) so that a surface roughness of the exposed oxide surface is replicated on the exposed etched surface. The oxide layer is preferably $SiO_2$ coated on the superconductor layer with sputtering. Sputtering is preferably bias sputtering and is preferably low frequency, such as 40 kHz, and the etching is dry etching with the etching material preferably comprising a mixture of $O_2$ and a gas containing C, H and halogen with a preferred composition being $CHF_3$.

The integrated circuit further includes an interleaved oxide layer disposed in surface contact with the ground plane; and at least one additional trilayer device each having another base electrode of NbN electrically coupled to the ground plane and in surface contact with the interleaved oxide layer; another tunnel layer in surface contact with the another base electrode; another counter electrode of NbN in surface contact with another tunnel layer; and another wiring layer in surface contact with the another counter electrode.

A trilayer-based superconductor integrated circuit in accordance with the invention includes a ground plane substrate of NbN having a top surface having a roughness below 4 nm rms; and at least one trilayer device each including a base electrode of NbN in surface contact with the top surface, a tunnel layer in surface contact with the base electrode, a counter electrode of NbN in surface contact with the tunnel layer, and a wiring layer in surface contact with the counter electrode. The tunnel layer may be AlN or MgO. The integrated circuit further includes an interleaved oxide disposed in surface contact with the ground plane; and at least one additional trilayer device each having another base electrode of NbN electrically coupled to the ground plane and on top of the interleaved oxide layer, another counter electrode of NbN in surface contact with another tunnel layer, and another wiring layer in surface contact with another counter electrode. The oxide layer is preferable $SiO_2$ and the tunnel layer preferably is MgO or AlN.

The resultant trilayer junctions have lower inductance and therefore perform better than the trilayer junctions fabricated on a smooth silicon dioxide surface in accordance with the prior art of FIG. 1.

BRIEF DESCRIPTION OF THE DRAWINGS

Like reference numerals illustrate like parts throughout the drawings.

DESCRIPTION OF THE PREFERRED EMBODIMENTS OF THE INVENTION

Figure 2:
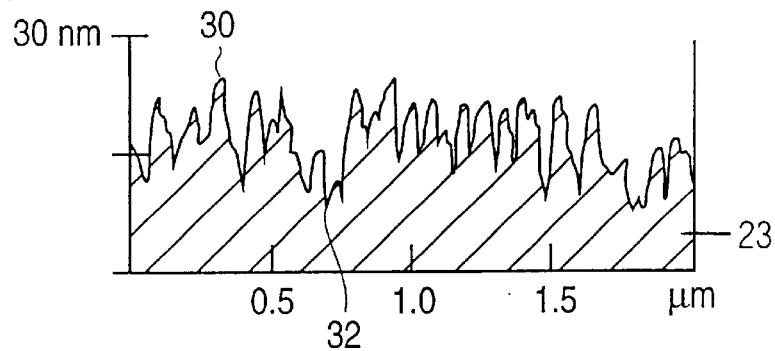
FIG. 2 illustrates a sectional view which illustrates surface peak to valley variation of the surface roughness of NbN in accordance with the prior art on which the prior art trilayer device of FIG. 1 is formed.

A process for reducing roughness on a surface of superconductor material, such as NbN, in accordance with the invention is illustrated in FIGS. 2–5. The starting point for the process is the prior art NbN substrate of FIG. 2. The NbN substrate (ground plane), as illustrated in FIG. 2, has peaks 30 and valleys 32 which vary between 15 and 20 nm in depth (over 4 nm rms) making it impossible to form a NbN/MgO/NbN trilayer device directly on the top surface of the substrate because of the unacceptable roughness of the top surface of the NbN.

Figure 3:
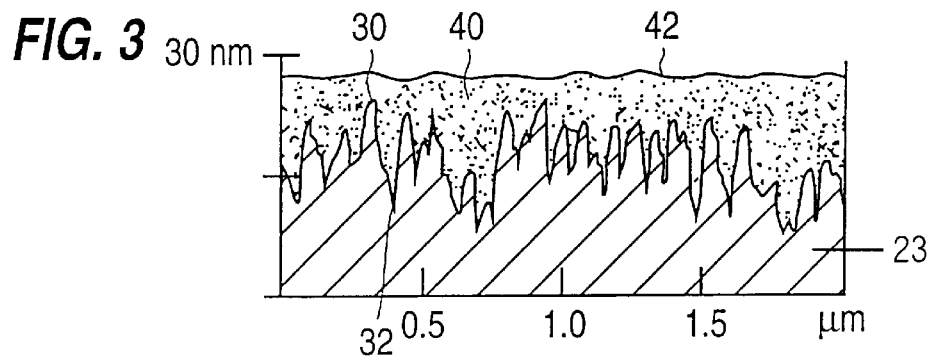
FIG. 3 illustrates a first step of the process of the present invention in which the NbN surface is filled by bias sputtering with an oxide to produce a smoother top surface than the rough top surface of the NbN of FIG. 2.

The present invention modifies the above described prior art processing of the NbN ground plane as discussed above and described in the aforementioned pending patent applications and publication by smoothing the top surface of the thick NbN ground plane sufficiently (less than 1 nm rms) to permit direct fabrication of the NbN/MgO/NbN trilayer devices on the NbN substrate. An oxide layer 40, as illustrated in FIG. 3, is directly formed on the rough top surface of the NbN by the use of low frequency bias sputtering to completely fill the peaks 30 and valleys 32 defining the surface roughness of FIG. 2 producing an exposed oxide surface 42 with a roughness less than the undesired surface roughness of the exposed surface of the NbN illustrated in FIG. 2. The relatively smooth top surface 42 has a preferred roughness of less than 1 nm rms and which may be as smooth as 0.1 nm rms.

While a preferred embodiment of the process of the present invention is to smooth the rough top surface of a thick NbN ground plane utilized in making superconductor Josephson junction integrated circuits containing NbN/MgO/NbN trilayer devices, it should be understood that the invention is applicable to other material systems in which it is desired to smooth an unacceptably rough surface. The smoothing may be an intermediate step in the fabrication of integrated circuits directly on a substrate or intermediate layer where a requisite surface smoothness is required beyond that obtained with the initial fabrication process of the superconductor material.

Figure 4:
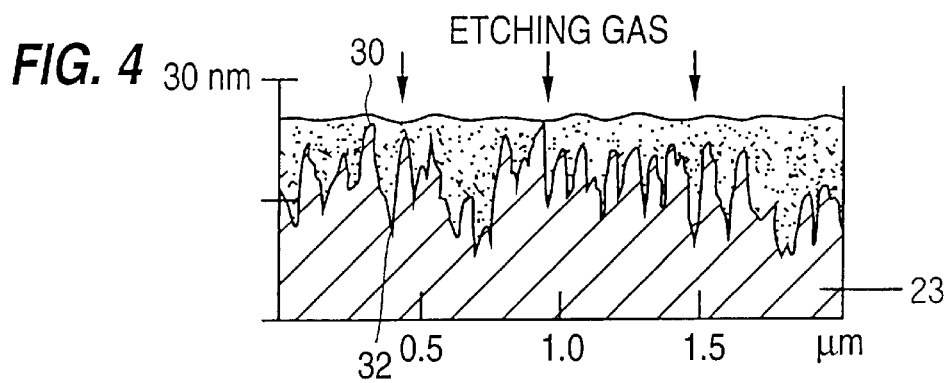
FIG. 4 illustrates an intermediate part of the etching process in accordance with the present invention in which the oxide filler and the NbN are etched at substantially the same rate.

FIG. 4 illustrates a first part of an etching process of the filling material 40 of FIG. 3. In accordance with the invention, the top surface 42 is etched with an etching material which etches the $SiO_2$ and the underlying NbN at substantially the same rate with the optimum etching rate being as close to 1:1 as possible with variations of less than ±10% from 1:1 being preferable. However, it should be understood that it is possible to practice the invention without a perfect match in the etching rate of $SiO_2$ and NbN as long as the resultant top surface after etching is smooth enough to permit direct fabrication of trilayer devices in direct contact with the top surface of the NbN without interfering with the function of the thin tunnel layer or other layers. As illustrated in FIG. 4, the etching process first removes a top layer of the $SiO_2$ until one or more peaks 30 of the rough underlying niobium nitride substrate are ready to be exposed.

Figure 5:
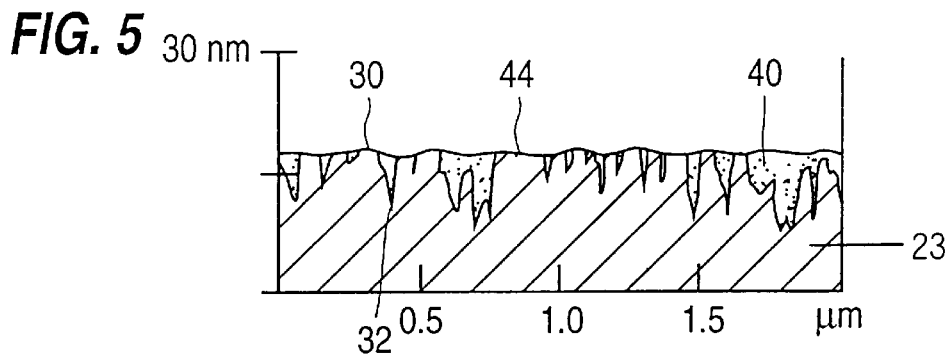
FIG. 5 illustrates the resultant filled NbN ground plane after etching is completed which has an exposed etched surface comprised of at least NbN and may contain the oxide filler.

The completion of the etching process is illustrated in FIG. 5. The etching when completed exposes at least a significant portion of the peaks 30 and a portion of the oxide layer 40 which provides surface exposure of the NbN thick ground plane substrate on which NbN/MgO/NbN devices may be directly formed without requiring the contoured portion 24 of the base 12 as in the prior art of FIG. 1. Because the etching material (preferably a dry etching mixture of gases) does not preferentially etch either the $SiO_2$ or the NbN, as the etching continues, the rough peaks 30 are removed at substantially the same rate as the deposited filler layer 40 of $SiO_2$. The top of surface 42 of the $SiO_2$ filler layer 40 is replicated on top surface 44 of the exposed etched surface. If the top surface 44 is viewed from above, the exposed etched surface of FIG. 5 includes truncated columns of NbN defined by the topping of the peaks 30 surrounded by $SiO_2$. While the $SiO_2$ filler layer 40 illustrated in FIG. 5 is not completely etched away because total exposure of the NbN substrate is unnecessary to permit successful fabrication of trilayer devices thereon, it should be understood that etching may be continued to totally remove the $SiO_2$.

While a preferred application of the process of the present invention is the reduction of surface roughness of NbN, it should be understood that the present invention may also be used to smooth rough surfaces of other superconductor or semiconductor materials which require surface smoothing to permit fabrication of integrated circuits.

The present invention is not limited to any particular type or form of etching as long as controlled non preferential etching of the filling oxide and NbN is produced. However, in a preferred embodiment, the etching is a dry etching which is performed with a mixture of gases. In a preferred formulation of etching material, a mixture of gases is used including $O_2$ and a gas containing C, H and a halogen, which is preferably fluorine $CHF_3$ but is not limited thereto.

The following is one example of an etching process to be used with the present invention.

|  | Gases | Flow (sccm) | P (mT) | Power | Time |
|---|---|---|---|---|---|
| Step 1: | $CHF_3$ | 100 | 100 | 300 | 4 min |
|  | $O_2$ | 37 |  |  |  |
| Step 2: | $CHF_3$ | 100 | 100 | 100 | 20% overetch |
|  | $O_2$ | 37 |  |  |  |

Wet Dip: Immerse in DI water.
    Dip 10 sec. in AlOx etch.
    D.I. water rinse in overflow rinser 5 min.
    Rinser/dryer: 60 sec. rinse, 180 sec. spin dry.
Water Probe: Probe contacts for ohmic contact resistance after etch.
Strip: Strip resist in AZ 300T for 30 min. at 80EC. Strip additional 15 min as needed.
    D.I. water rinse in overflow rinser 5 min.
    Spin dry in rinser/dryer for 180 sec.
    Acetone-3 rinse 5 min. Isopropyl alcohol rinse 5 min.
    D.I. water rinse in overflow rinser 5 min.
    Rinser/dryer: 60 sec. rinse, 180 sec. spin dry.

Figure 1:
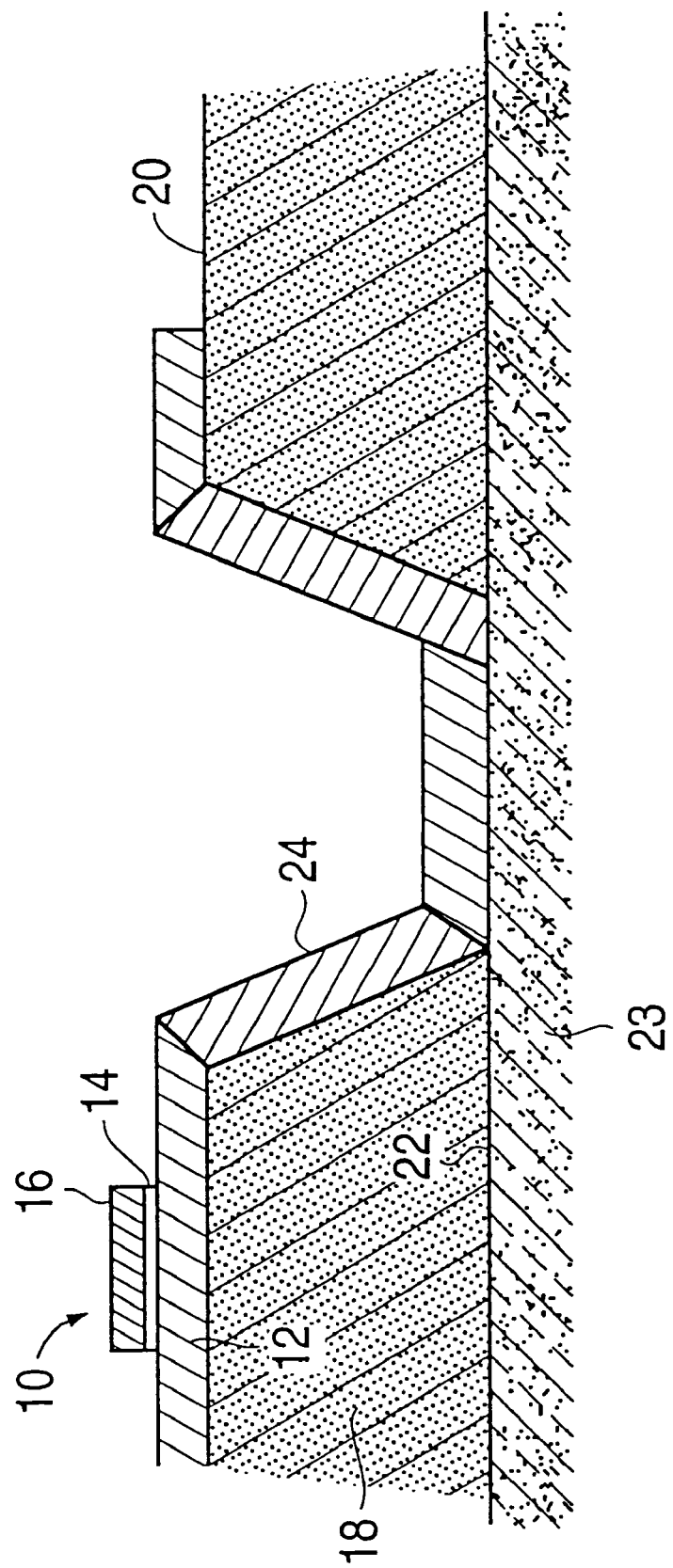
FIG. 1 is a cross sectional view of a NbN/MgO/NbN trilayer device in accordance with the prior art.

The substrate illustrated in FIG. 5 of NbN is a starting point of forming an NbN/MgO/NbN trilayer integrated circuit utilized in superconductor applications. The smoother top surface 44 permits the forming of the NbN/MgO/NbN trilayer devices directly on the top surface as described below in conjunction with FIG. 6 which reduces the parasitic inductance resultant from connection between the contoured extension 24 at the NbN substrate 23 as illustrated in FIG. 1.

Figure 6:
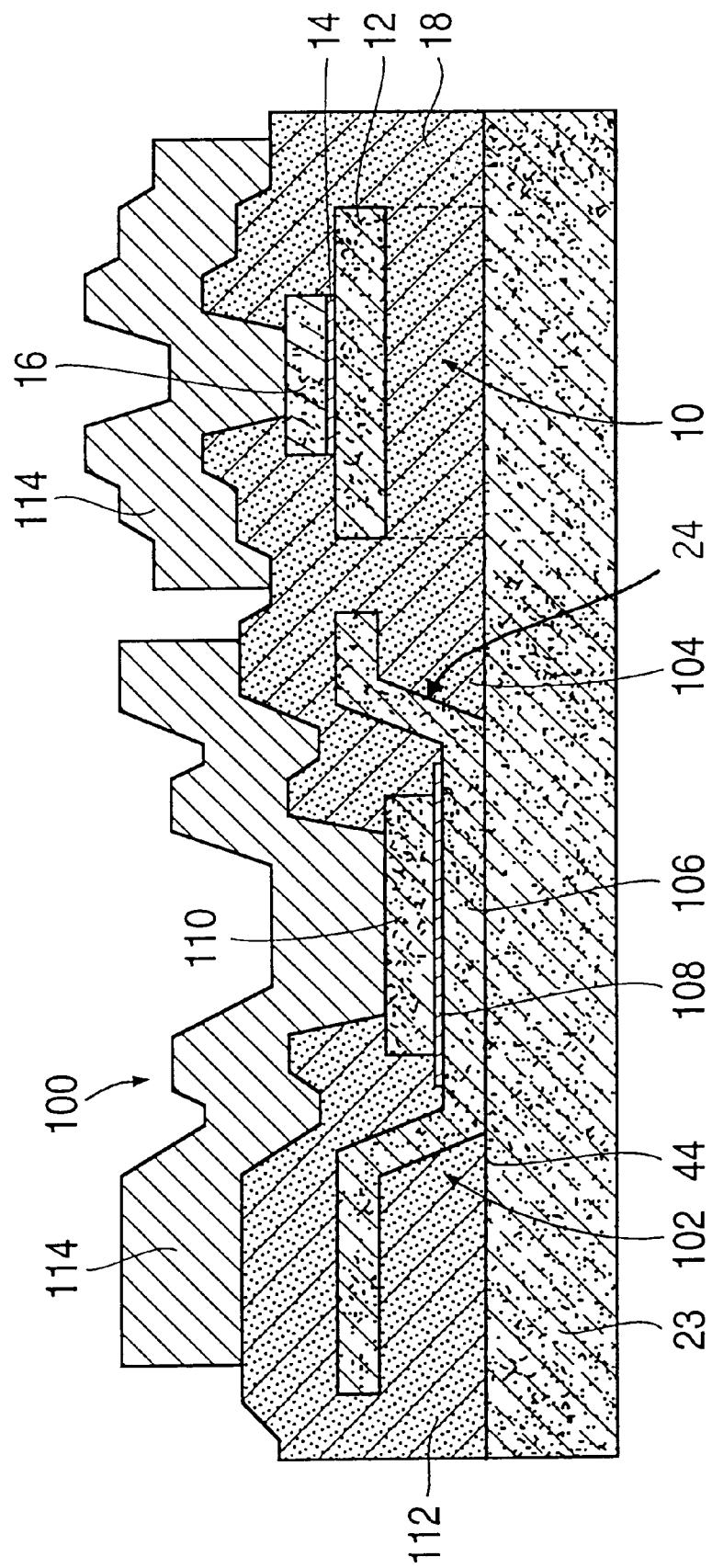
FIG. 6 illustrates a sectional view of a trilayer superconductor integrated circuit formed on a substrate of NbN in accordance with the present invention.

FIG. 6 illustrates a sectional view of a NbN/MgO/NbN trilayer superconductor integrated circuit 100 formed directly on a NbN ground plane 23 in accordance with the present invention. The NbN/MgO/NbN trilayer devices 102 are formed on the NbN ground plane 23 with only one being illustrated. Each device 102 has the same three layer construction as in the prior art but is formed directly on the top surface 44 of ground plane 23 smoothed by the above described process. The same steps used to form the prior art trilayer NbN devices 10 may be used to form the trilayer devices 102.

The NbN/MgO/NbN trilayer devices 102 function as the active element in the integrated circuit which operate as Josephson tunnel junctions when refrigerated to approximately 10 K.

The trilayer superconductor integrated circuit 100 differs from the prior art by having the trilayer devices 102 formed directly on the NbN thick ground plane 23 having a surface 44 of decreased roughness processed in accordance with FIG. 5 or having the $SiO_2$ completely etched away to expose only NbN. In practice the stopping of the etching process is not precisely controlled so that across the etched surface area 44 of the NbN thick ground plane 23 all of the $SiO_2$ or sufficient $SiO_2$ may be removed to provide sufficient electrical coupling between the devices 102 and the thick NbN ground plane 23 to reduce parasitic inductance. The ground plane 23 is preferably approximately 500 nm in thickness which is positioned on top of a thermally oxidized silicon wafer but is not limited thereto and has a surface smoothness of preferably less than 3 nm rms and preferably 1.0 nm or less rms which is substantially reduced from that which characterizes the prior art of FIG. 2 of being greater than 4 nm rms surface roughness. The top surface 44 is in direct contact with a base electrode 106 of NbN preferably having a thickness of 100 nm, but it should be understood that the invention is not limited thereto. The formation of the base electrode 106 is in accordance with the processes described in the aforementioned patent applications and publication. On top of the base electrode 106 is tunnel barrier 108 which is preferably MgO, AlN or other known tunnel materials. If MgO is used to fabricate the tunnel barrier 108, its thickness is approximately 1 nm. The process for depositing the tunnel barrier 108 is in accordance with the aforementioned patent applications and publication. On top of the tunnel barrier 108 is a counter electrode 110 also formed from NbN which preferably has a thickness of approximately 100 nm. A dielectric oxide layer 112, which is preferably $SiO_2$ deposited by low frequency bias sputtering in accordance with the process of the aforementioned patent applications and publication, is directly deposited on the top surface 44 of the NbN ground plane 22 in areas where the base electrode 106 does not directly contact the NbN ground plane 23. Electrical contact is made with the top surface of the counter electrode by wiring 114 which is produced in accordance with the process described in the aforementioned patent applications and publication.

The present invention also permits trilayer devices 102 to be formulated in combination with the prior art NbN/MgO/NbN devices 10 of FIG. 1. The use of the prior art NbN/MgO/NbN devices 10 in combination with the NbN/MgO/NbN devices 102 of the present invention is useful in applications where circuit topologies do not permit the direct contact of all trilayer devices to the thick ground plane 23 such as when the trilayer devices must be in series. The NbN/MgO/NbN trilayer devices 10 are in accordance with the prior art as described in the aforementioned patent applications and publication. The illustrated trilayer device 10 (one or more are present) is electrically coupled to the NbN ground plane 23 by a contoured extension 24 of the base electrode 12. The interleaved oxide layer 104 also of $SiO_2$ is in surface contact with the top surface 44 of the NbN ground plane 23.

As is apparent from FIG. 6, the present invention permits the trilayer devices 10 and 102 to be fabricated on a thick NbN ground plane 23. The devices 10 have lower switching rates than the devices 102. However, aside from the additional processing required to smooth the rough top surface 44 of the NbN into the smooth surface 44 to permit direct fabrication of devices 102 on the ground plane 23, the remaining process steps for making devices 10 and 102 are compatible and require the same materials.

The trilayer devices 102, as illustrated in FIG. 6, which are in direct contact with a NbN ground plane 23, have less parasitic inductance as a consequence of there being no contoured extension 24 to the NbN ground plane from the vertical offset of the trilayer device 10 as illustrated in FIG. 6.

Additionally, the present invention provides increased circuit density having a larger number of trilayer devices 102. The elimination of the contoured extension 24 of the base electrode 12 to the NbN ground plane 23 permits greater trilayer device density.

While not described in detail it should be understood that the present invention utilizes conventional semiconductor processing steps, such as the utilization of photoresist, to define the direct connection of the trilayer devices 102 to the NbN ground plane 23 at selected areas.

The present invention permits high yield LSI and VLSI superconductor integrated circuits to be fabricated which have predictable device characteristics, have stable and well-characterized thin-film deposition processes and provide control of critical dimensions. The resultant trilayer devices 102 are repeatable and the fabrication process is controlled with a feedback control of MgO and NbN sputtering parameters.

The present invention is utilized in conjunction with the fabrication of resistors which is not described in detail herein. A fabrication of resistors is described in the aforementioned patent applications and publication.

While the present invention has been described in terms of its preferred embodiment, it should be understood that numerous modifications may be made thereto without departing from the spirit and scope of the present invention. It is intended that all such modifications fall within the scope of the appended claims.

What is claimed is:

1. A process for reducing roughness of a surface of superconductor material having an undesirable surface roughness comprising:

coating the surface with an oxide layer to fill the undesirable surface roughness and to produce an exposed oxide surface with a roughness less than the undesirable surface roughness; and etching the exposed oxide surface to remove a thickness of the oxide layer followed by removing at least a portion of the oxide layer filling the undesirable surface roughness and a portion of the surface of the superconductor material to produce an exposed etched surface comprised of at least the superconductor material which has a surface roughness less than the undesirable surface roughness.

2. The process of claim 1 wherein:

the exposed etched surface also comprises the oxide layer.

3. The process of claim 1 wherein:

the etching is performed with an etching material which etches each of the oxide layer and the superconductor material at substantially the same rate so that a surface roughness of the exposed oxide surface is replicated on the exposed etched surface.

4. The process of claim 2 wherein:

the etching is performed with an etching material which etches each of the oxide layer and the superconductor material at substantially the same rate so that a surface roughness of the exposed surface is replicated on the exposed etched surface.

5. A process in accordance with claim 1 wherein:

the oxide layer is $SiO_2$ coated on the surface of the superconductor layer with sputtering.

6. A process in accordance with claim 2 wherein:

the oxide layer is $SiO_2$ coated on the surface of the superconductor layer with sputtering.

7. A process in accordance with claim 1 wherein:

the coating of the surface with the oxide layer is produced by bias sputtering;

the etching is dry etching; and the superconductor material is a NbN film.

8. A process in accordance with claim 2 wherein:

the coating of the surface with the oxide layer is produced by bias sputtering;

the etching is dry etching; and the superconductor material is a NbN film.

9. A process in accordance with claim 3 wherein:

the coating of the surface with the oxide layer is produced by bias sputtering;

the etching is dry etching; and the superconductor material is a NbN film.

10. A process in accordance with claim 4 wherein:

the coating of the surface with the oxide layer is produced by bias sputtering;

the etching is dry etching; and the superconductor material is a NbN film.

11. A process in accordance with claim 3 wherein:

the etching material comprises a mixture of $O_2$ and a gas containing carbon, hydrogen and a halogen.

* * * * *